United States Patent [19]
Sehier et al.

[11] Patent Number: 5,929,703
[45] Date of Patent: Jul. 27, 1999

[54] METHOD AND DEVICE FOR MODELING AM-AM AND AM-PM CHARACTERISTICS OF AN AMPLIFIER, AND CORRESPONDING PREDISTORTION METHOD

[75] Inventors: Philippe Sehier, St-Germain-En-Laye, France; Rossano Marchesani, Chieti, Italy

[73] Assignee: Alcatel Telspace, Nanterre Cedex, France

[21] Appl. No.: 08/906,893

[22] Filed: Aug. 6, 1997

[30] Foreign Application Priority Data

Aug. 7, 1996 [FR] France .................................. 96 09949

[51] Int. Cl.⁶ ........................................................ H03F 1/26
[52] U.S. Cl. ............................................. 330/149; 455/126
[58] Field of Search ........................ 330/149, 2; 455/126; 332/160

[56] References Cited

U.S. PATENT DOCUMENTS

| | | | |
|---|---|---|---|
| 4,291,277 | 9/1981 | Davis et al. | 330/149 |
| 4,700,151 | 10/1987 | Nagata | 330/149 |
| 5,049,832 | 9/1991 | Cavers | 330/149 |
| 5,107,520 | 4/1992 | Karam et al. | 332/160 |
| 5,148,448 | 9/1992 | Karam et al. | 455/126 |
| 5,524,286 | 6/1996 | Chiesa et al. | 330/149 |
| 5,699,383 | 12/1997 | Ichiyoshi | 330/149 |
| 5,732,333 | 3/1998 | Cox et al. | 455/126 |

OTHER PUBLICATIONS

Lohtia et al, "Power amplifier linearization using cubic spline interpolation", 43RD IEEE Vehicular Technology Conference, May 18–20, 1993, New York, US pp. 676–679.

Stapleton & Cavers, "A new technique for adaptation of linearizing predistorters", 41ST IEEE Vehicular Technology Conference, May19–22, 1991, Institute of Electrical and Electronics Engineers, pp. 753–758.

Stapleton et al, "Simulation and analysis for an adaptive predistorter utilizing a complex spectral convolution", IEEE Transactions on Vehicular Technology, vol. 41, No. 4, Nov. 1, 1992, New York, US, pp. 387–394.

Zwillinger, "Standard Mathematical Tables and Forulae", 1996, CRC Press, Boca Raton, US, pp. 676–682.

*Primary Examiner*—Robert Pascal
*Assistant Examiner*—Khanh Van Nguyen
*Attorney, Agent, or Firm*—Sughrue, Mion, Zinn, Macpeak & Seas, PLLC

[57] ABSTRACT

A method of modeling the AM—AM and AM-PM characteristics of an amplifier includes the step of transmitting a reference signal to the amplifier. The response of the amplifier to the reference signal is digitized to produce two sets of AM—AM and AM-PM reference samples, respectively. Two series of polynomials respectively representative of the AM—AM and the AM-PM characteristics are determined from the samples. The determination of each polynomial allows for the second derivative of the polynomial and for the distances between the samples and points on the curve defined by the polynomial.

10 Claims, 5 Drawing Sheets

METHOD AND DEVICE FOR MODELING AM-AM AND AM-PM CHARACTERISTICS OF AN AMPLIFIER, AND CORRESPONDING PREDISTORTION METHOD

BACKGROUND OF THE INVENTION

1. Field of the Invention

The field of the invention is that of the transmission of modulated signals having a non-constant modulation envelope. To be more precise, the invention concerns the predistortion of such signals before they are transmitted.

2. Description of the Prior Art

Thus the invention applies in particular to QPSK or QAM modulation. The invention has been particularly developed for the TETRA (Trans European Trunk Radio System) standard for private mobile radio (PMR), intended, for example, for the networks used by the fire and police services, taxi fleets, etc.

The TETRA system uses π/4-DQPSK modulation in the base transceiver station (BTS).

Non-constant envelope modulation imposes operation over a wide range of the dynamic range of the amplifier (unlike constant envelope modulation). It therefore imposes a great variation of the power response of the amplifier, which leads to distortion phenomena.

This problem is well known. Predistortion of the signal before it is amplified is used to combat it. This predistortion must be calculated for optimum compensation of the distortion induced by the amplifier, so that the resultant signal is degraded as little as possible by the distortion.

Various predistortion techniques are already known in themselves. These include an analogue method known as cartesian co-ordinate feedback and a self-adaptive method.

The predistortion to be applied can be calculated by the spline method. This technique is described in "A practical guide to splines", C. de Boor, Springer Verlag, 1978.

The object of this technique is to determine the AM—AM (amplitude) and AM-PM (phase) characteristics of the amplifier in order to control the predistortion to be applied.

To this end, a reference signal is transmitted to the amplifier (a two-tone signal in the TETRA case), the response of the amplifier is digitized to produce a series of samples and the AM—AM and AM-PM characteristics are modified using the spline technique.

This modeling consists of the production of a curve by linking two successive samples by cubic interpolation. In other words, a sliding window selecting four consecutive points is applied to the samples and, for the two central points, the polynomial defining the curve passing through these four points is found and its second derivative is minimized.

This technique has several drawbacks.

In particular, the modeling obtained in this way is relatively sensitive to quadrature and balance defects and to the intermediate frequency (IF) phase noise.

The modeling curve obtained (see FIG. 2, discussed below) is generally very "agitated" in the presence of measurement errors and therefore passes through all the samples produced.

Objectives of the invention include alleviating these various drawbacks of the prior art.

To be more precise, one objective of the invention is to provide a method of modeling the AM—AM and AM-PM characteristics of an amplifier.

Another objective of the invention is to provide a method of this kind producing smoother calculated curves than the conventional spline technique.

A further objective of the invention is to provide a method of this kind reducing spurious transmission in adjacent channels and in particular, in the case of the TETRA system, rejection better than is required by the standard.

An additional objective of the invention is to provide a method of this kind with limited sensitivity to:

quadrature defects, balance defects,

IF phase noise, noise of any type.

Another objective of the invention is to provide a method of the above kind that can replace the spline technique without requiring any modification of the transmitter.

SUMMARY OF THE INVENTION

These objectives, and others that will emerge hereinafter, are achieved in accordance with the invention with the aid of a method of modeling the AM—AM and AM-PM characteristics of an amplifier, including the following steps:

transmitting a reference signal to the amplifier, digitizing the response of the amplifier to the reference signal to produce two sets of AM—AM and AM-PM reference samples, respectively, determining two series of polynomials respectively representative of the AM—AM and the AM-PM characteristics from the samples allowing for each of the polynomials for the second derivative of the polynomial and for the distances between the samples and points of the curve defined by the polynomial.

In this way, it is possible to "smooth" the curves defined by the polynomial. These curves are more efficient, in particular in terms of reducing adjacent channel interference and sensitivity to defects.

The invention is based on a novel approach to modeling the AM—AM and AM-PM characteristics. With the conventional spline technique, the objective is to determine the best curve passing through all the samples obtained from the reference signal. Using the invention, however, the curve is allowed to depart substantially from the samples, so as to smooth the curve.

The skilled person considers the samples obtained to be reliable references because they are derived from a known reference signal. However, the inventors limit the confidence placed in these samples because they appear to be subject to various disturbances during their amplification and therefore are not completely accurate.

In other words, the invention proposes a new technique allowing for the fact that the reference samples are affected by the various sources of noise.

Each of said polynomials is preferably determined for two consecutive samples and minimizes a linear combination of the following three parameters:

second derivative of the polynomial, distance between the polynomial and one sample, distance between the polynomial and the other sample.

Note that using only the second derivative corresponds to the conventional spline technique. The novelty of the invention therefore resides in allowing for the distances. In other words, the AM—AM and AM-PM responses are modeled using a "relaxed spline" method.

The linear combination is advantageously written:

$$J = \int_{x_1}^{x_N} (w''(x))^2 dx + \frac{1}{\rho} \sum_{1}^{N} \left( w(x_i) - y_i \right)^2$$

where $\rho$ is a weighting coefficient.

In one preferred embodiment of the invention, said weighting coefficient $\rho$ varies as a function of at least one parameter from the group comprising:

the quadrature error,
the balance error,
the temperature,
the defects induced by the demodulator,
the phase noise,
the overall noise,
the average characteristic of the curve.

Depending on the conditions encountered, it appears desirable to increase the smoothing of the curve ($\rho$ greater, increased distances) or to track the samples obtained a little more closely ($\rho$ smaller, second derivative great).

The determination of the polynomials advantageously employs a pentadiagonal calculation matrix. This technique is derived from that described by De Boor in the aforementioned work, using a tridiagonal matrix for a conventional spline.

In one particular embodiment, which can be applied to the TETRA system, for example, the reference signal is made up of two test frequencies transmitted regularly and separated by a beat frequency band chosen to cover a very narrow frequency band to represent the baseband response of the amplifier without interfering with the adjoining channels.

The determination of the polynomials is advantageously used to update a predistortion table.

The invention also concerns devices for modeling the AM—AM and AM-PM characteristics of an amplifier using the method described above. A device of this kind includes:

means for digitizing the response of the amplifier to the reference signal delivering two sets of AM—AM and AM-PM reference samples, respectively and means for determining two series of polynomials respectively representative of the AM—AM and the AM-PM characteristics from the samples allowing for each polynomial for the second derivative of the polynomial and for the distances between the samples and the points of the curve defined by the polynomial.

The invention further concerns a method of predistorting a signal modulated with non-constant envelope modulation by modeling the AM—AM and AM-PM characteristics of an amplifier, the method including the following steps:

transmitting a reference signal at regular intervals to the amplifier, digitizing the response of the amplifier to the reference signal so as to produce two sets of AM—AM and AM-PM reference samples, respectively, determining two series of polynomials respectively representative of the AM—AM and the AM-PM characteristics from the samples allowing for the second derivative of the polynomial and for the distances between the samples and points of the curve defined by the polynomial, measuring a parameter representative of the signal to be transmitted, and predistortion multiplication of the signal to be transmitted in accordance with the polynomials and the representative parameter.

The representative parameter can be selected from the group comprising:

the power of the signal to be transmitted,
the square of the power of the signal to be transmitted,
the modulus of the signal to be transmitted.

Other features and advantages of the invention will emerge more clearly from a reading of the following description of one preferred embodiment of the invention given by way of non-limiting illustrative example only and from the accompanying drawings.

$\rho$=0 (corresponding to the conventional spline method),
$\rho$=10 (corresponding to moderate smoothing), and
$\rho$=100 (corresponding to heavy smoothing).

Figure 2:
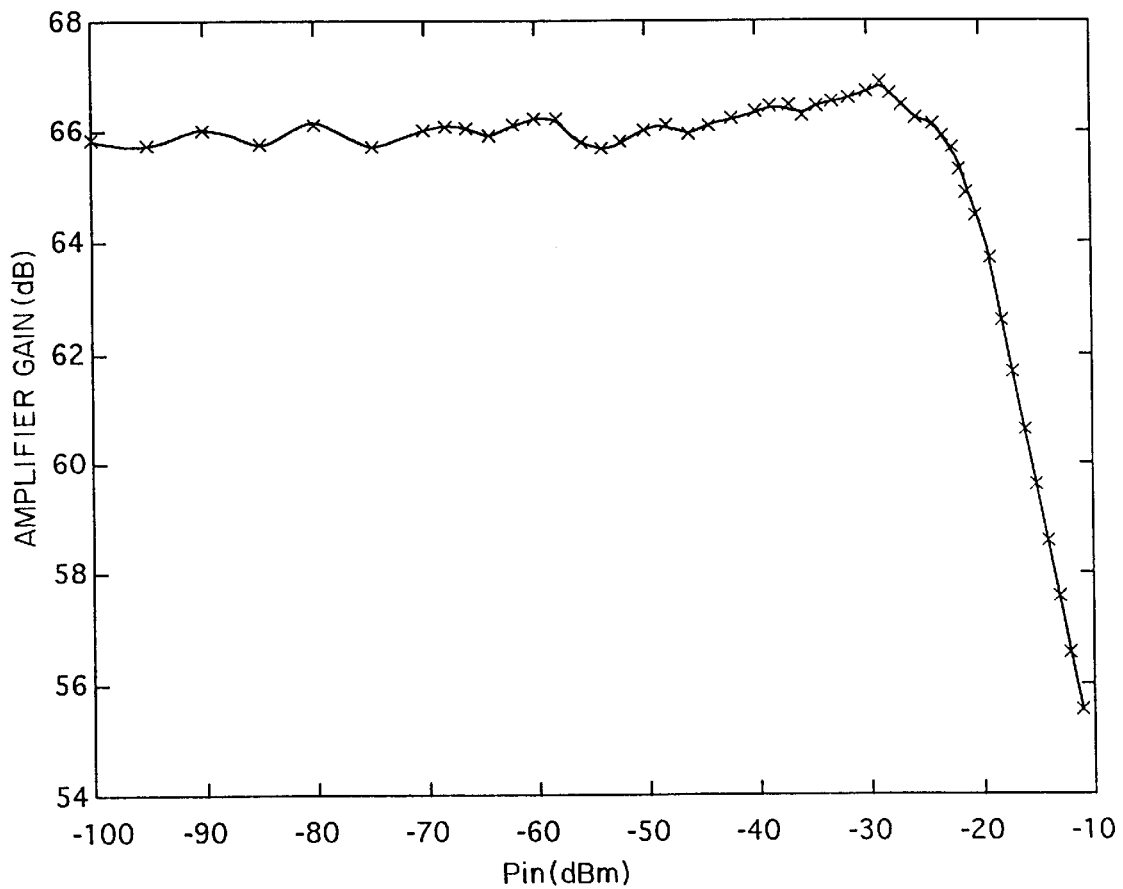
FIGS. 2, 3 and 4 show examples of AM—AM characteristics as a function of gain calculated by the method of FIG. 1 in the following cases.
Figure 3:
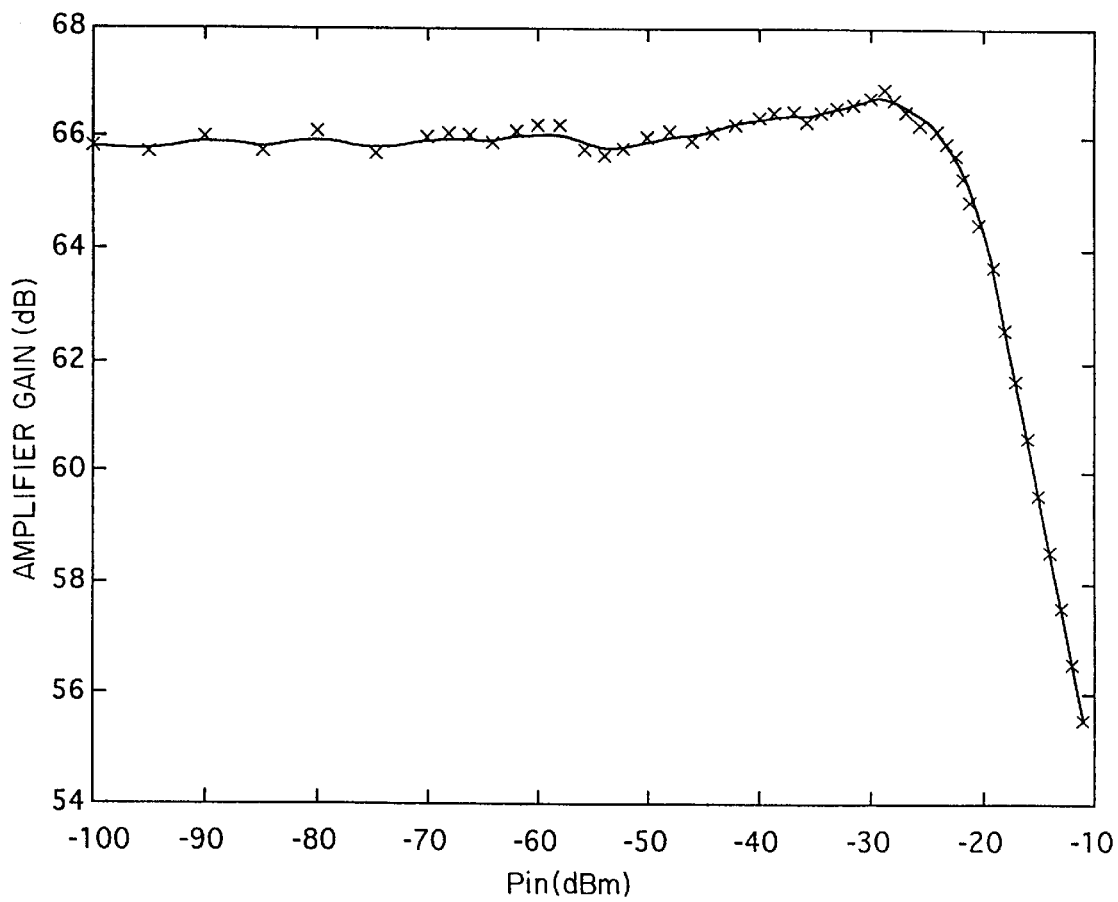
Figure 4:
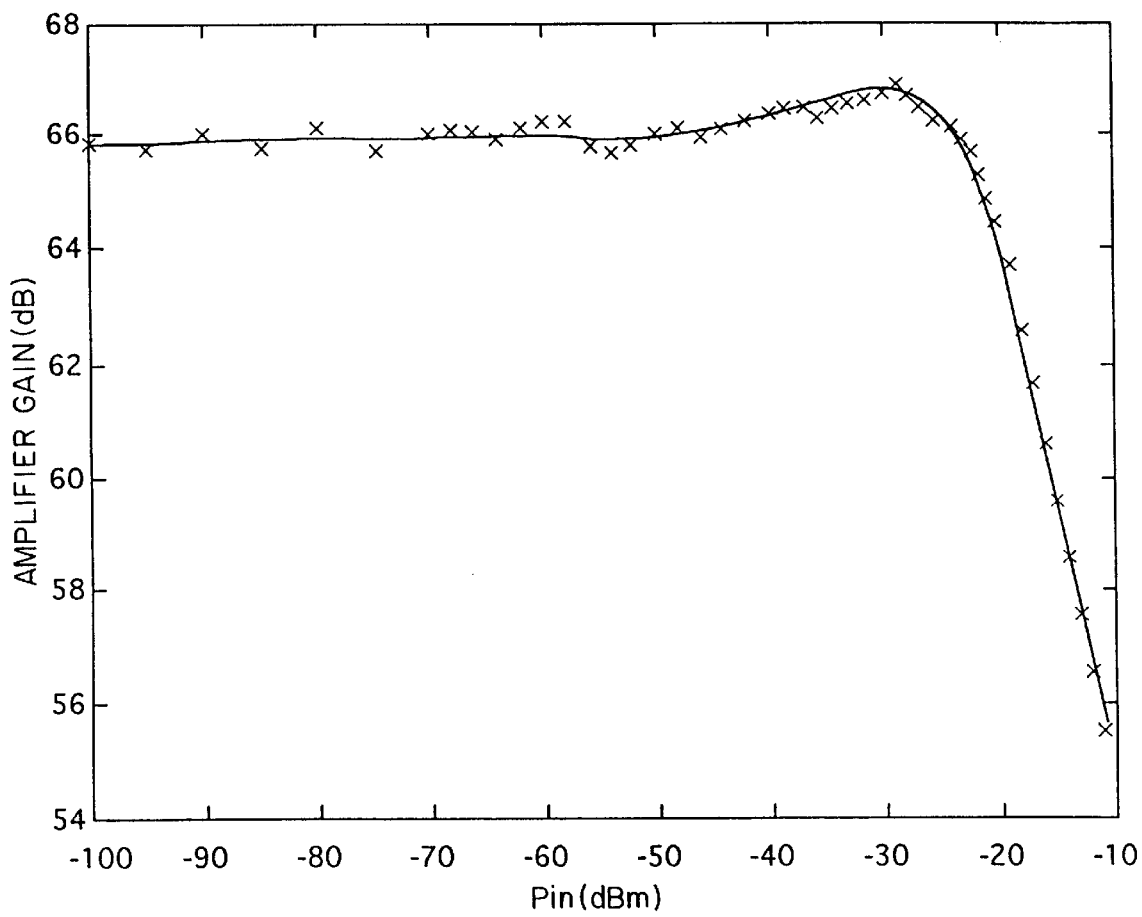
Figure 5:
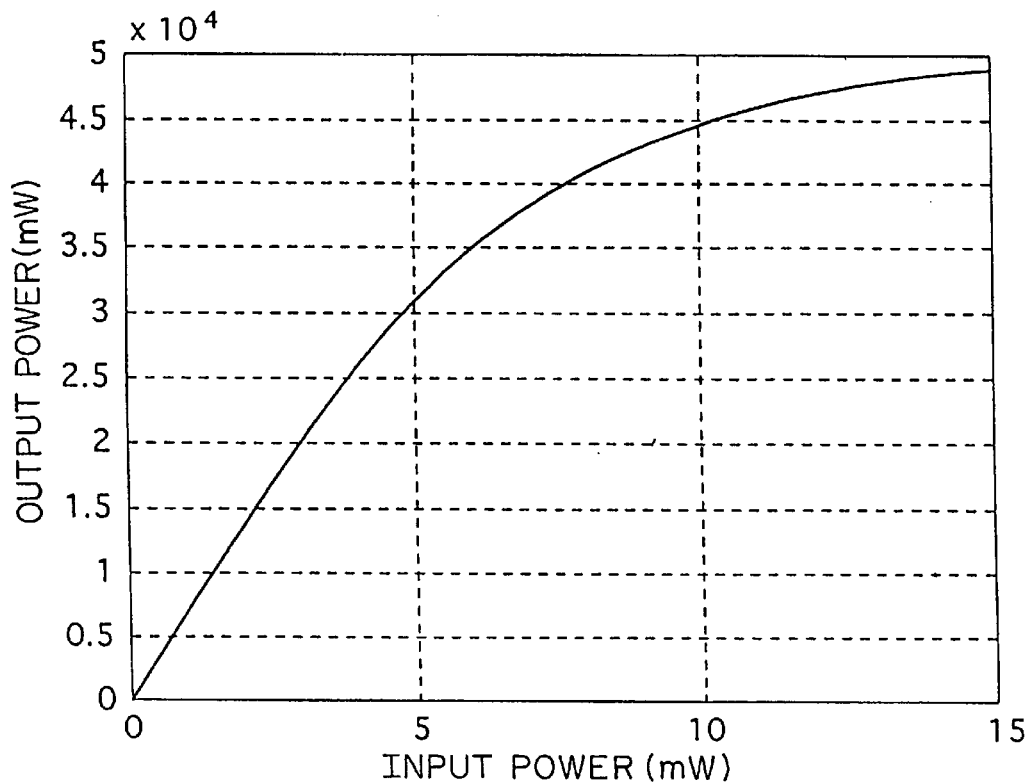

FIG. 5 shows a theoretical AM—AM characteristic of the amplifier as a function of the output power corresponding to the characteristics of the amplifier modeled in FIGS. 2 through 4.

Figure 1:
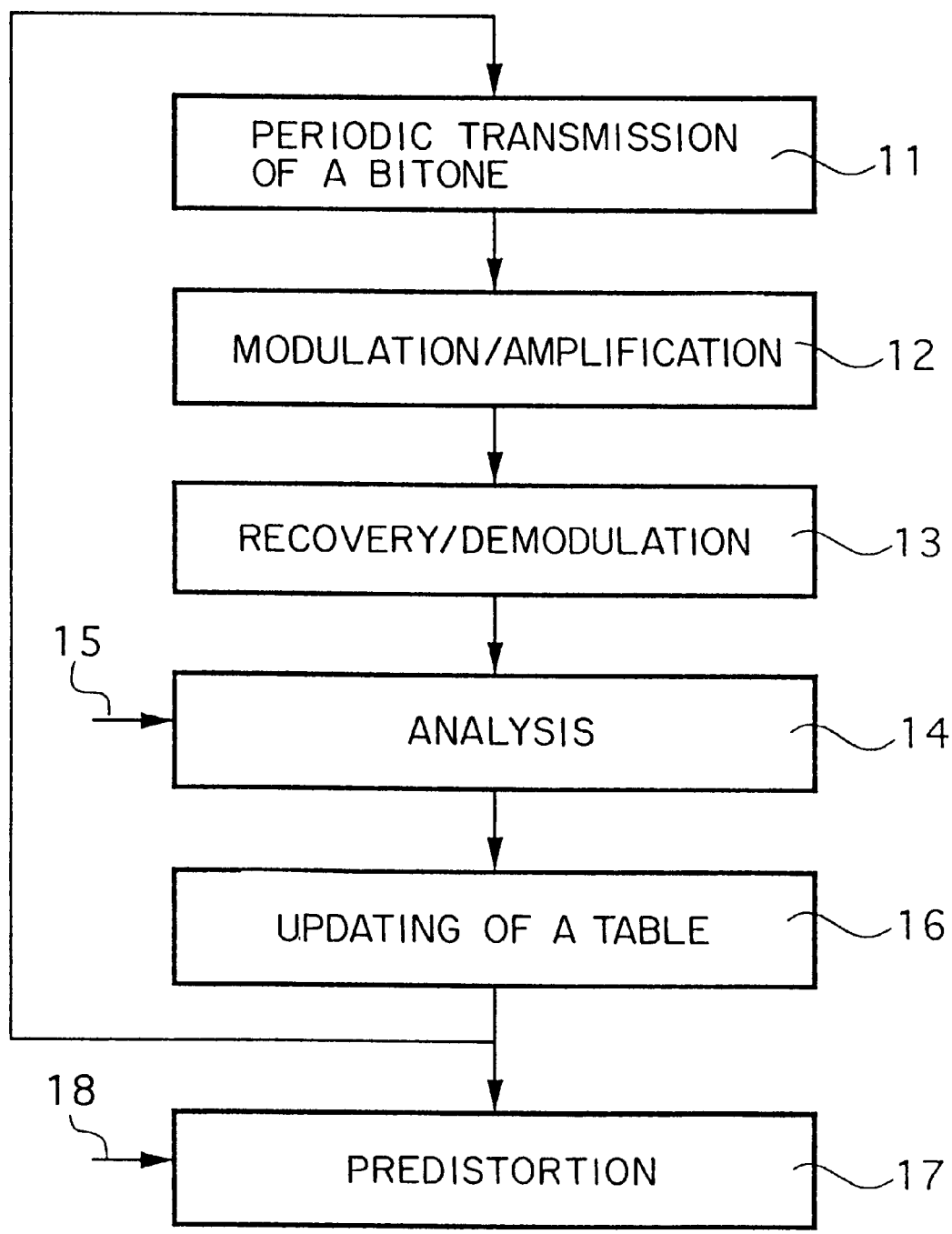
FIG. 1 is a simplified block schematic of the method of the invention.
Figure 6:
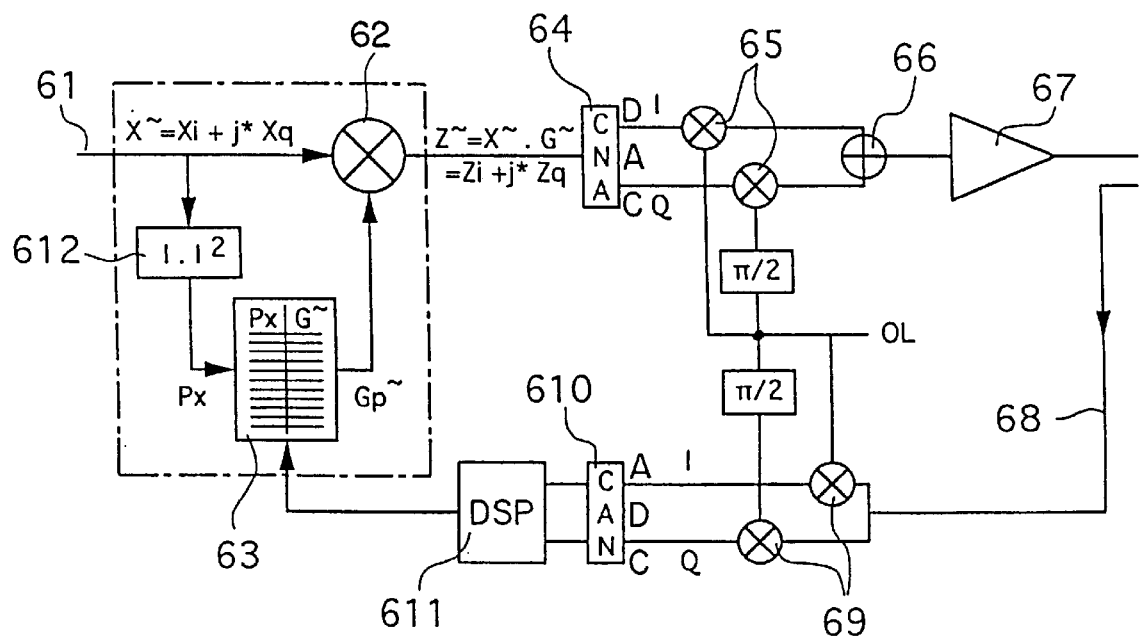

FIG. 6 shows a device implementing the method from FIG. 1.

DETAILED DESCRIPTION OF THE PREFERRED EMBODIMENTS

The preferred embodiment described below applies to the TETRA system which uses the frequency band from 380 MHz to 520 MHz divided into a series of channels.

FIG. 1 is a schematic outlining the method of the invention.

Step 11: A reference signal of 6 ms duration is transmitted regularly (every 4 seconds). This reference signal comprises two test frequencies (referred to hereinafter as a "bitone") for each channel:

$f_1 = f_c + 5$ kHz $f_2 = f_c + 6$ kHz where $f_c$ is the central frequency of the channel.

This produces a beat frequency of 1 kHz, covering the baseband of the amplifier without interfering with the adjacent channel.

Step 12: The bitone is modulated and then amplified, like the rest of the signal. It is then subject to distortion due to the amplification. The amplified bitone is recovered, demodulated and digitized (step 13) and then analyzed (step 14).

The invention essentially concerns this analysis step. As already indicated, this analysis consists in determining the AM—AM and AM-PM characteristics from samples obtained by digitizing the transmitted bitone.

FIGS. 2 through 4 show three AM—AM characteristics of a power amplifier in different situations. The crosses show the samples obtained:

FIG. 2 shows the characteristics obtained by the spline technique known in itself. It is obvious that this curve is relatively "bumpy" because of measurement errors. This is because this curve has to be made to pass through all the samples produced.

The inventors have found that many sources of errors can affect these samples. Consequently, the latter do not necessarily reflect the reality of the predistortion. It is therefore, preferable, even though this goes against the perceived wisdom of the skilled person, to smooth the curve, accepting that it does not pass exactly through each sample.

FIGS. 3 and 4 show two characteristics of this type. It can be seen that they are "smooth" compared to FIG. 2.

The calculation employed in accordance with the invention to obtain these curves can be interpreted as an improvement of the spline technique as developed in the work by De Boor already cited.

This technique consists in considering four consecutive samples and of associating with the two central samples the portion of the curve defined by the polynomial of power less than or equal to three passing through the four samples and having the lowest second derivative.

The invention proposed additionally to allow for the distances (affixes) from each point on this curve portion to the two samples in question and to minimize these distances. The aim of the calculation is therefore to minimize a combination of the following three parameters:

second derivative (w") of the polynomial (w), distance of the polynomial from sample $P_1$: $d_1^2 = (w_{(P1)} + w)^2$, distance of the polynomial from sample $P_2$: $d_2^2 = (w_{(P2)} + w)^2$.

Depending on the transmission conditions, it may be preferable to emphasize the second derivative (passing through the samples) or smoothing. FIGS. 3 and 4 show two situations respectively corresponding to $\rho=10$ and $\rho=100$.

It is clear that in FIG. 4 the emphasis is on smoothing.

The calculation method and the mathematical justification for this technique are specified in the appendix to the present application. In particular, it is shown how the calculation can be implemented in practise in the form of a pentadiagonal matrix for 15 polynomials, for example.

The choice of the factor $\rho$ depends on one or more parameters 15, such as:

the quadrature error, the balance error, the temperature, the defects induced b the demodulator, the phase noise, the global noise, the mean characteristics of said curve.

The results of the analysis (step 14) are used to update (step 16) a table associating the predistortion (step 17) to be applied with a parameter 18 representative of the power.

The predistortion table can therefore have its inputs graduated in modulus or in power. For correcting high-power non-linearities, a graduation in power is preferable because of its finer coverage of the area concerned.

In the case of the amplifier used for the TETRA system base transceiver stations, the basis is a theoretical amplifier having hyperbolic tangential characteristics which approximate the experimental results for the first amplifier, as shown in FIG. 5.

The conditions are generally as follows:

Maximum power of TETRA signal: 0.007 mW i.e. −21.5 dBm,

Theoretical power gain: $3.32 \cdot 10^6$ i.e. 65 db,

Maximal output power: 24 W i.e. 44 dBm,

Predistortion table on 12 bits filtered and graduated in power.

FIG. 6 shows the device of the invention for an amplifier of this kind in particular.

The signal 61 to be transmitted (including the reference bitone every four seconds) $x\sim = x_i + j^* x_q$ drives a predistortion multiplier 62 to produce the signal $$z\sim = x\sim \cdot g\sim = z_i + j^* z_q$$

where G represents the predistortion factor supplied by the table of values 63.

Then, conventionally, this signal is converted to analog form by a digital to analog converter 64, modulated by a modulator 65 onto two channels I and Q in phase quadrature which are added by an adder 66 and then amplified by an amplifier 67.

The amplified bitone signal 68 is recovered, demodulated by a demodulator 69 on two channels I and Q and digitized by an analog to digital converter 610 before driving a signal processor 611 which calculates the AM—AM and AM-PM characteristics as described above. To be more precise, the operations carried out include acquisition of the non-linearity, calculation of the modulus and updating of the table.

Depending on these characteristics, the table 63 is updated every four seconds.

This table is addressed by a parameter $P_x$ representative of the power of the input signal 61 and its power squared 612.

APPENDIX

ADJUSTMENT AND INTERPOLATION CUBICAL SPLINES

The cubical spline functions are the functions of $S_2$. They are therefore characterized as follows:

i) $\underline{w}$ is a polynomial of the third order or less on each range $]t_i, t_{i+1}[$, $i=1, \ldots, N-1$, ii) $\underline{w}$ is a first order binomial on $]a, t_1[, ]t_n, b[$, iii) w" is continuous on $]a, b[$, and iv) $w(t_i) = z_i$, $i=1, \ldots, N$ for the interpolation splines, v) $w(t_i) + \rho_i(w'''(t_i^+) - w'''(t_i^+)) = z_i$, $i=1, \ldots, N$ for the adjustment splines.

A method of determining these adjustment splines (of which the interpolation splines are a special case) is described below.

Let $u_i$ be the second derivative of $\underline{w}$ with respect to $t_i$. The second derivative is expressed in the range $[t_i, t_{i+1}]$:

$$w''(t) = u_i \frac{t_{i+1} - t}{t_{i+1} - t_i} + u_{i+1} \frac{t - t_i}{t_{i+1} - t_i} \quad (1)$$

because this is a first order polynomial. Letting $h_i = t_{i+1} - t_i$ and by integrating twice the expression (1) over $[t_i, t_{i+1}]$:

$$w(t) = \frac{u_i}{6h_i}(t_{i+1} - t_i)^3 + \frac{u_{i+1}}{6h_i}(t - t_i)^3 + A_i t + B_i \quad (2)$$

where $A_i$ and $B_i$ are integration constants. We seek now an expression for these constants. Expressed in $t_i$ and $t_{i+1}$, the expression (2) yields the following linear system:

$$\begin{cases} A_i t_i + B_i = w(t_i) - \frac{u_i}{6} h_i^2 \end{cases}$$

-continued $$\left\{ A_i t_{i+1} + B_i = w(t_{i+1}) - \frac{u_{i+1}}{6} h_i^2 \right.$$

Solving it yields:

$$A_i = \frac{w(t_{i+1}) - w(t_i)}{h_i} - \frac{h_i}{6}(u_{i+1} - u_i) \quad (3)$$

$$B_i = \frac{t_{i+1}w(t_i) - t_i w(t_{i+1})}{h_i} - \frac{h_i}{6}(t_{i+1}u_i - t_i u_{i+1}) \quad (4)$$

The expression (2) is then written, for an $t$ in the range $[t_i, t_{i+1}]$:

$$w(t) = \frac{u_i}{6}(t_{i+1} - t)\left(\frac{(t_{i+1} - t)^2}{h_i} - h_i\right) + \frac{u_{i+1}}{6}\left(\frac{(t - t_i)^2}{h_i} - h_i\right) + (t_{i+1} - t)\frac{w(t_i)}{h_i} + (t - t_i)\frac{w(t_{i+1})}{h_i}$$

This expression shows that the adjustment spline is entirely known at any point of ]a, b[ if its values and those of its second derivative are known at each point $t_i$. It will now be shown that the values of the spline at the point $t_i$ can be expressed as a function of the values of the second derivatives at the same points.

Differentiating the expression (1) for the $t$ in the range $[t_i, t_{i+1}]$:

$$\left(\frac{\rho_{i-1}}{h_{i-1} \cdot h_{i-2}}\right)u_{i-2} + \left(\frac{h_{i-1}}{6} - \frac{\rho_i}{h_{i-1}}\left(\frac{1}{h_{i-1}} + \frac{1}{h_i}\right) - \frac{\rho_{i-1}}{h_{i-1}}\left(\frac{1}{h_{i-1}} + \frac{1}{h_{i-2}}\right)\right)u_{i-1} +$$

$$\left(\frac{h_{i-1} + h_i}{3} + \frac{\rho_{i+1}}{h_i^2} + \rho_i\left(\frac{1}{h_i} + \frac{1}{h_{i-1}}\right)^2 + \frac{\rho_{i-1}}{h_{i-1}^2}\right)u_i +$$

$$\left(\frac{h_i}{6} - \frac{\rho_{i+1}}{h_i}\left(\frac{1}{h_i} + \frac{1}{h_{i+1}}\right) - \frac{\rho_i}{h_i}\left(\frac{1}{h_i} + \frac{1}{h_{i-1}}\right)\right)u_{i+1} +$$

$$\left(\frac{\rho_{i+1}}{h_i \cdot h_{i+1}}\right)u_{i+2} = \frac{z_{i+1} - z_i}{h_i} - \frac{z_i - z_{i-1}}{h_{i-1}}$$

where $h$ represents the distance from the current point to the affix and where $\rho$ is a predetermined parameter.

Letting:

$$a_i = \frac{h_i + h_{i+1}}{3} + \frac{\rho_{i+2}}{h_{i+1}^2} + \frac{\rho_i}{h_i^2} + \rho_{i+1}\left(\frac{1}{h_{i+1}} + \frac{1}{h_i}\right)^2$$

$$b_i = \frac{h_{i+1}}{6} - \frac{\rho_{i+1}}{h_{i+1}}\left(\frac{1}{h_{i+1}} + \frac{1}{h_i}\right) - \frac{\rho_{i+2}}{h_{i+1}}\left(\frac{1}{h_{i+2}} + \frac{1}{h_{i+1}}\right)$$

$$c_i = \frac{\rho_{i+2}}{h_{i+1} \cdot h_{i+2}}$$

$$d_i = \frac{z_{i+2} - z_{i+1}}{h_{i+1}} - \frac{z_{i+1} - z_i}{h_i}$$

yields:

$$c_{i-3} \cdot u_{i-2} + b_{i-2} \cdot u_{i-1} + a_{i-1} \cdot u_i + b_{i-1} \cdot u_{i+1} + c_{i-1} \cdot u_{i+2} =$$

$$\frac{z_{i+1} - z_i}{h_i} - \frac{z_i - z_{i-1}}{h_{i-1}} = d_{i-1}$$

The calculation of the global curve can therefore be written using a pentadiagonal matrix in the following form:

$$\begin{bmatrix} a_1 & b_1 & c_1 & & & & \\ b_1 & a_2 & b_2 & c_2 & & & \\ c_1 & b_2 & a_3 & b_3 & c_3 & & \\ & c_2 & b_3 & a_4 & b_4 & c_4 & \\ & & & & c_{n-5} & b_{n-4} & a_{n-3} & b_{n-3} \\ & & & & & c_{n-4} & b_{n-3} & a_{n-2} \end{bmatrix} \begin{bmatrix} u_2 \\ u_3 \\ u_4 \\ u_5 \\ u_{n-2} \\ u_{n-3} \end{bmatrix} = \begin{bmatrix} d_1 \\ d_2 \\ d_3 \\ d_4 \\ d_{n-3} \\ d_{n-2} \end{bmatrix}$$

There is claimed:

1. A method of modeling the AM—AM and AM-PM characteristics of an amplifier including the following steps:
    transmitting a reference signal to said amplifier,
    digitizing the response of said amplifier to said reference signal to produce two sets of AM—AM and AM-PM reference samples, respectively,
    determining two series of polynomials respectively representative of the AM/AM and AM/PM characteristics from the samples, where the second derivatives of those polynomials and the distance between the samples points and the polynomials are used to define the curves.

2. The method claimed in claim 1 wherein each of said polynomials is determined for two consecutive samples and minimizes a linear combination of the following three parameters:
    second derivative of said polynomial,
    distance between said polynomial and one sample,
    distance between said polynomial and the other sample.

3. The method claimed in claim 2 wherein said linear combination is written:

$$J = \int_{x_1}^{x_N} (w''(x))^2 dx + \frac{1}{\rho} \sum_{1}^{N} \left( w(x_i) - y_i \right)^2$$

where $\rho$ is a weighting coefficient.

4. The method claimed in claim 3 wherein said weighting coefficient $\rho$ varies as a function of at least one parameter from the group comprising:
    the quadrature error,
    the balance error,
    the temperature,
    the defects induced by the demodulator,
    the phase noise,
    the overall noise,
    the average characteristic of said curve.

5. The method claimed in claim 2 wherein a pentadiagonal calculation matrix is used to determine said polynomials.

6. The method claimed in claim 1 wherein said reference signal comprises two test frequencies transmitted regularly and separated by a beat frequency band chosen to cover a very narrow frequency band substantially corresponding to the baseband response of said amplifier.

7. The method claimed in claim 1 wherein said determination of said polynomials is used to update a predistortion table.

8. A device for modeling the AM—AM and AM-PM characteristics of an amplifier using a reference signal transmitted to said amplifier, including:
    means for digitizing the response of said amplifier to said reference signal delivering two sets of AM—AM and AM-PM reference samples, respectively, and
    means for determining two series of polynomials respectively representative of the AM/AM and AM/PM characteristics from the samples, where the second derivatives of those polynomials and the distance between the sampled points and the polynomials are used to define the curves.

9. A method of predistorting a signal modulated with non-constant envelope modulation by modeling the AM—AM and AM-PM characteristics of an amplifier including the following steps:

transmitting a reference signal at regular intervals to said amplifier, digitizing the response of said amplifier to said reference signal so as to produce two sets of AM—AM and AM-PM reference samples, respectively, determining two series of polynomials respectively representative of the AM/AM and AM/PM characteristics from the samples, where the second derivatives of those polynomials and the distance between the sampled points and the polynomials are used to define the curves.

measuring a parameter representative of the signal to be transmitted, and predistortion multiplication of said signal to be transmitted in accordance with said polynomials and said representative parameter.

10. The method claimed in claim 9 wherein said representative parameter is from the group comprising:

the power of said signal to be transmitted, the square of the power of said signal to be transmitted, the modulus of said signal to be transmitted.

* * * * *